US007830022B2

(12) United States Patent
Theuss et al.

(10) Patent No.: US 7,830,022 B2
(45) Date of Patent: Nov. 9, 2010

(54) SEMICONDUCTOR PACKAGE

(75) Inventors: Horst Theuss, Wenzenbach (DE); Adolf Koller, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 376 days.

(21) Appl. No.: 11/876,241

(22) Filed: Oct. 22, 2007

(65) Prior Publication Data

US 2009/0102054 A1 Apr. 23, 2009

(51) Int. Cl.
*H01L 23/52* (2006.01)
*H01L 23/48* (2006.01)
*H01L 29/40* (2006.01)

(52) U.S. Cl. ............................. 257/779; 257/E23.023; 257/773; 257/780; 257/786

(58) Field of Classification Search .......... 257/E23.023, 257/E21.238, 786, 784, 780, 779, 737, 738, 257/773; 438/113; 361/770, 760, 767, 768, 361/773, 774, 808; 174/260, 261
See application file for complete search history.

(56) References Cited

U.S. PATENT DOCUMENTS 5,450,055 A * 9/1995 Doi ........................... 338/332
5,639,013 A * 6/1997 Jairazbhoy et al. ....... 228/248.1
5,656,547 A * 8/1997 Richards et al. ............. 438/460
5,684,677 A * 11/1997 Uchida et al. ............... 361/770
5,818,107 A * 10/1998 Pierson et al. .............. 257/723
5,936,846 A * 8/1999 Jairazbhoy et al. .......... 361/770
6,285,085 B1 * 9/2001 Taguchi ...................... 257/780
6,597,059 B1 7/2003 McCann et al.
7,019,397 B2 * 3/2006 Ohuchi et al. ............... 257/734
2006/0118938 A1 6/2006 Tandy

OTHER PUBLICATIONS

Edward Furgut, "Taking Wafer Level Packaging to the Next Stage: A 200 mm Silicon Technology Compatible Embedded Device Technology", SEMICON Europa 2006, Munich, Germany (17 pgs).
M. Brunnbauer, "An Embedded Device Technology Based on a Molded Reconfigured Wafer", 2006 ECTC San Diego, May 31-Jun. 1, 2006 (5 pgs.).

* cited by examiner

*Primary Examiner*—Chris Chu
(74) *Attorney, Agent, or Firm*—Dicke, Billig & Czaja, PLLC

(57) ABSTRACT

A semiconductor package is disclosed. One embodiment provides a semiconductor package singulated from a wafer includes a chip defining an active surface, a back side opposite the active surface, and peripheral sides extending between the active surface and the back side; a contact pad disposed on the active surface; and a metallization layer extending from the contact pad onto a portion of the peripheral sides of the chip.

24 Claims, 6 Drawing Sheets

W W 100 28a 22 26 20 28b 110 110 106 50 30 24 32 50 106 102 104

SEMICONDUCTOR PACKAGE

BACKGROUND

Market demand for smaller and more functional electronic devices has driven the development of semiconductor devices, packages, and recently, entire systems disposed on a chip. Many electronic devices, such as cellular telephones, employ a variety of design-specific electronic components. However, the space available inside the electronic devices is limited, particularly as the electronic devices are made smaller.

Most semiconductor package solutions provide a chip coupled to a carrier and one or more electronic components coupled to the carrier adjacent to the chip. Carriers, or interposers, are an additional component to the package, and add both weight and thickness to the package solution. Some semiconductor package solutions provide a wafer level package singulated from a wafer and including a chip that is not carried by a package interposer. A bottom portion of these wafer level packages are soldered to a board or other electronic device. It is difficult to view the electrical solder/connection formed between the bottom portion of the package and the board when inspecting the assembled devices.

Package manufacturers have a desire to fabricate semiconductor packages having an economy of scale that are suited to meet the needs of consumers. Industrial consumers have a desire to efficiently attach semiconductor packages to boards and quality-check the boards for performance and function prior to sale. Both the manufacturers and the consumers of these advanced semiconductor devices desire devices that are reduced in size and yet have increased device functionality.

SUMMARY

One aspect provides a semiconductor package singulated from a wafer. The semiconductor package includes a chip defining an active surface, a back side opposite the active surface, and peripheral sides extending between the active surface and the back side; a contact pad disposed on the active surface; and a metallization layer extending from the contact pad onto a portion of the peripheral sides of the chip.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as “top,” “bottom,” “front,” “back,” “leading,” “trailing,” etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms “coupled” and/or “electrically coupled” are not meant to mean that the elements must be directly coupled together; intervening elements may be provided between the “coupled” or “electrically coupled” elements.

Embodiments provide a semiconductor package including a sidewall metallization layer that is configured for improved electrical connection with printed circuit boards. In one embodiment, the semiconductor package is a wafer level semiconductor package that is singulated from a semiconductor wafer and includes an in situ formation of a metallization layer that extends from an active surface of the semiconductor package to a peripheral sidewall on a semiconductor package.

The sidewall metallization layer formed on the peripheral sides of the semiconductor package enables improved electrical connection between semiconductor package and printed circuit boards to which the package is attached. In addition, embodiments provide a sidewall metallization layer extending from sides of a semiconductor package that enables visual confirmation of electrical contacts formed between the semiconductor package and the board to which the package is attached. The visual confirmation of electrical contact with the semiconductor package enables an end-user customer to quickly confirm, for example in an optical inspection process, that the electronic device has been properly soldered and is suited for use in automotive and other applications.

Figure 1:
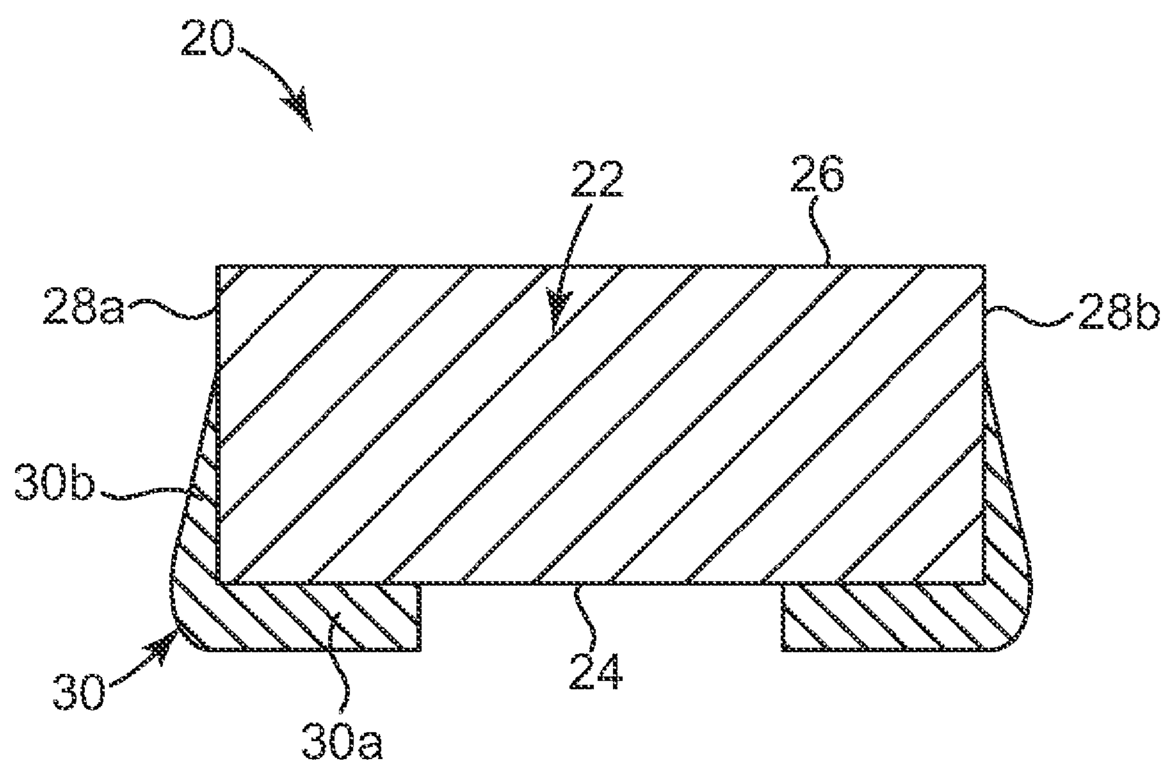
FIG. 1 is a cross-sectional view of a semiconductor package including a sidewall metallization layer according to one embodiment.

FIG. 1 is a cross-sectional view of a semiconductor package 20 according to one embodiment. Semiconductor package 20 includes a chip 22 defining an active surface 24, a back side 26 opposite active surface 24, peripheral sides **28*a*, 28*b* extending between active surface 24 and back side 26, and a metallization layer 30 extending from active surface 24 to peripheral sidewall 28***a*. In one embodiment, metallization layer 30 includes a first portion 30*a* in contact with active surface 24 and a second portion 30*b* that is adjacent to and in contact with peripheral side 28*a*. In one embodiment, a thickness of second portion 30*b* disposed on peripheral sidewall 28*a* is less than a thickness of first portion 30*a* that contacts active surface 24.

In one embodiment, chip 22 includes diodes, transistors, memory chips, logic chips, and other suitable semiconductor chips. In one embodiment, semiconductor package 20 is singulated from a semiconductor wafer to define a wafer level package having an active surface 24. In some embodiments, wafer level package 20 is configured for coupling to a board such that active surface 24 is adjacent to the board and back side 26 is opposite the board. Other configurations for semiconductor package 20 are also acceptable.

FIG. 1 illustrates a cross-sectional view showing metallization layer 30 extending from active surface 24 to peripheral sidewall 28*a*. In one embodiment, package 20 includes a metallization layer 30 extending from active surface 24 to each peripheral sidewall 28 of package 20. In one embodiment, metallization layer 30 extends continuously and uniformly over at least a portion of each peripheral sidewall 28 of package 20.

Figure 2:
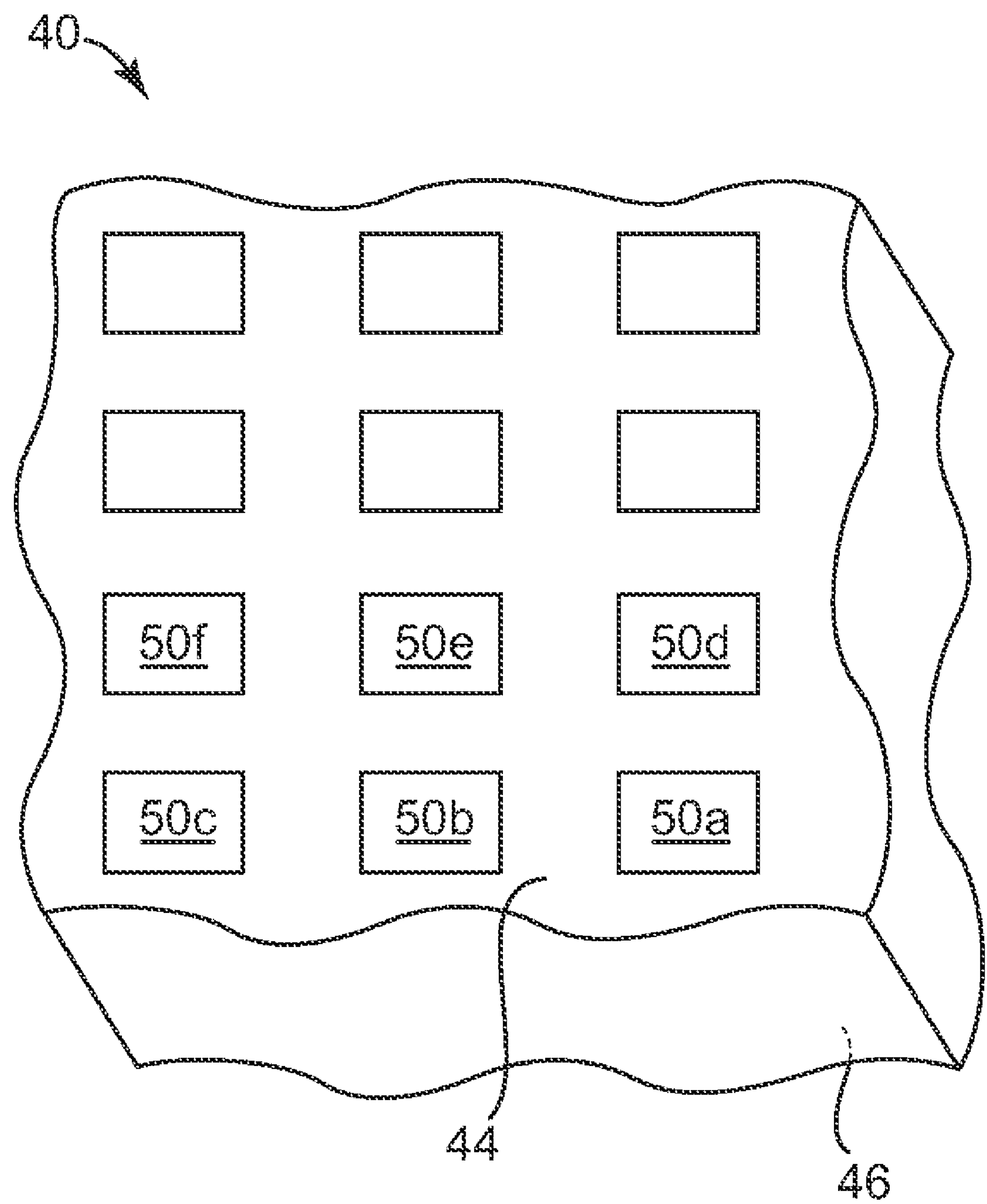
FIG. 2 is a perspective view of a portion of a semiconductor wafer including a plurality of contact pads coupled to an active surface of the wafer according to one embodiment.

FIG. 2 is a perspective view of a portion of a semiconductor wafer 40 according to one embodiment. Semiconductor wafer 40 includes an active surface 44 opposite a back side 46 and a plurality of contact pads 50*a*, 50*b*, 50*c*, 50*d*, 50*e*, and 50*f*, for example, disposed on active surface 44. Wafer 40 includes circular semiconductor wafers ranging in size from 25.4 mm to 300 mm fabricated to include multiple semiconductor chips. It is to be understood that the view of wafer 40 as shown in FIG. 2 is only a portion of a larger wafer. In one embodiment, active surface 44 of wafer 40 is fabricated to define multiple semiconductor chips in electrical communication with pads 50*a*-50*f*. Wafer 40 is configured to be singulated to provide semiconductor chips useful in packaging and other electronic solutions.

Figure 3:
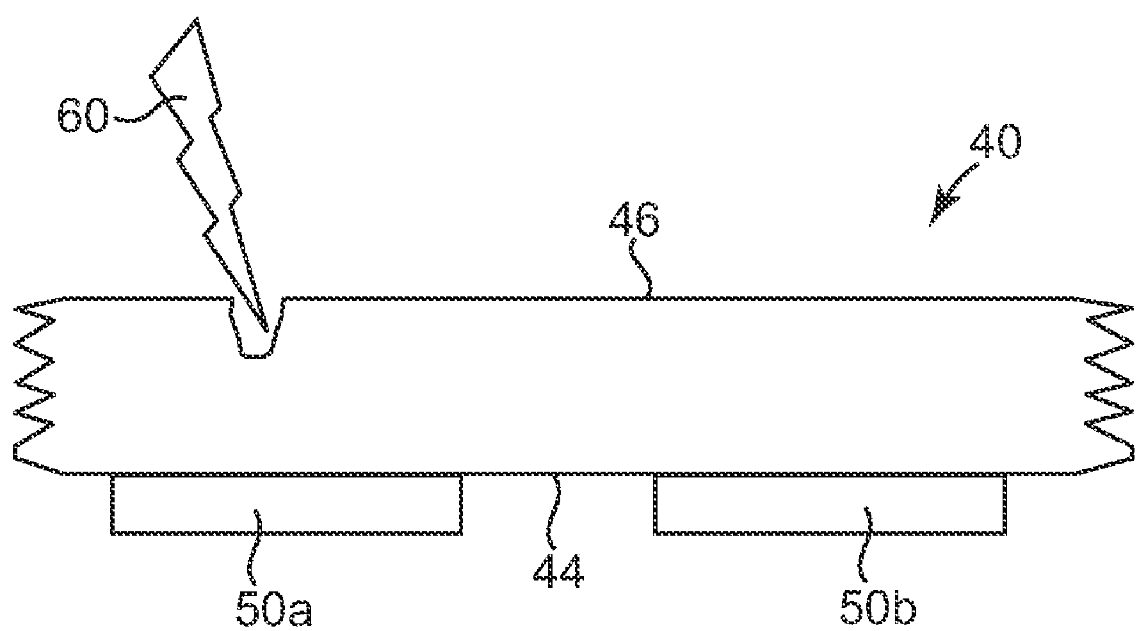
FIG. 3 is a side view of a singulation process applied to the semiconductor wafer shown in FIG. 2.

FIG. 3 is a side view of wafer 40 oriented such that back side 46 is exposed to a tool 60 and active surface 44 is down (or away from tool 60) relative to the drawing. In one embodiment, back side 46 of wafer 40 includes a back surface of a silicon wafer substrate and pads 50*a*, 50*b* include metal. In one embodiment, pads 50*a*, 50*b* include tin, alloys of tin, gold, alloys of gold, compounds of gold and tin, and other suitable metal pads.

In one embodiment, back side 46 of wafer 40 is cut with tool 60 or a source 60 from back side 46 through active surface 44 and pads 50*a*, 50*b*. In one embodiment, tool 60 is an implement suited for singulating a semiconductor wafer and includes saws, lasers, cutting blades, and the like. In one embodiment, tool/source 60 includes a laser or other energetic source configured to singulate wafer 40 from back side 46 through pads 50*a*, 50*b*. In one embodiment, tool/source 60 heats wafer 40 when singulating packages 20 in a manner that cuts back side 46 and melts pads 50*a*, 50*b*. In some embodiments, when source 60 singulates packages 20 from wafer 40, silicon of wafer 40 is oxidized and metal in pads 50*a*, 50*b* is melted and displaced to sides 28. It has been surprisingly discovered that the energetic singulation of wafer 40 provides desirable additional electrical insulation to sides 28 of chips 22 through the oxidation of the silicon wafer back side 46.

In one embodiment, laser 60 includes a neodymium-doped yttrium aluminum garnet (Nd:YAG) laser operated at about 10 Watts, a frequency of about 10 kHz, and a wavelength of about 355 nanometers. One suitable laser 60 includes a Nd:YAG laser in the form of an Nd:$Y_3Al_5O_{12}$ solid state laser.

In general, the Nd:YAG laser typically emits light at a wavelength of about 1064 nanometers in the infrared spectrum, although transitions near the 940, 1120, 1320, and 1440 nanometer range are present. Suitable lasers may be operated in both pulsed and/or continuous mode. One suitable laser includes an Nd:YAG laser available from Han's Laser Technology Company, Houston, Tex. Other suitable lasers and laser providers are also acceptable.

Figure 4:
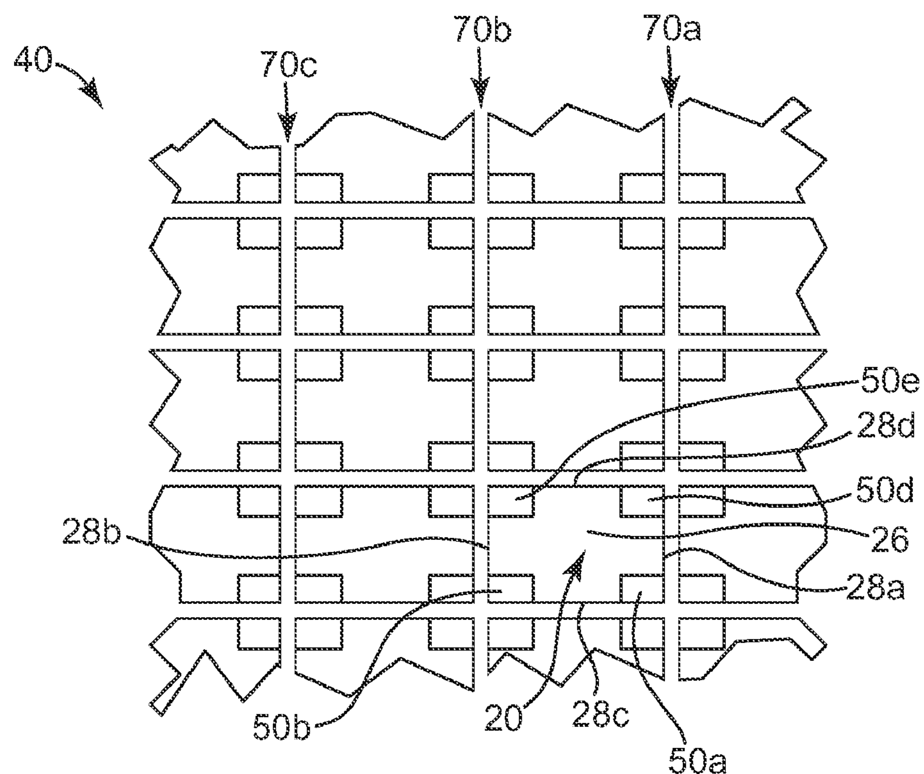
FIG. 4 is a view of the contact pads and the active surface of the semiconductor wafer shown in FIG. 2 after singulation.

FIG. 4 is a view of wafer 40 directed toward contact pads 50*a*, 50*b* after singulation of wafer 40 into discrete semiconductor packages 20. In one embodiment, tool/source 60 (FIG. 3) singulates wafer 40 along streets 70*a*, 70*b*, 70*c* into a plurality of separate wafer level semiconductor packages 20. After singulation, semiconductor package 20, for example, includes opposing sidewalls 28*a*, 28*b* and contact pad portions 50*a*, 50*b*, 50*d*, 50*e*.

Figure 5:
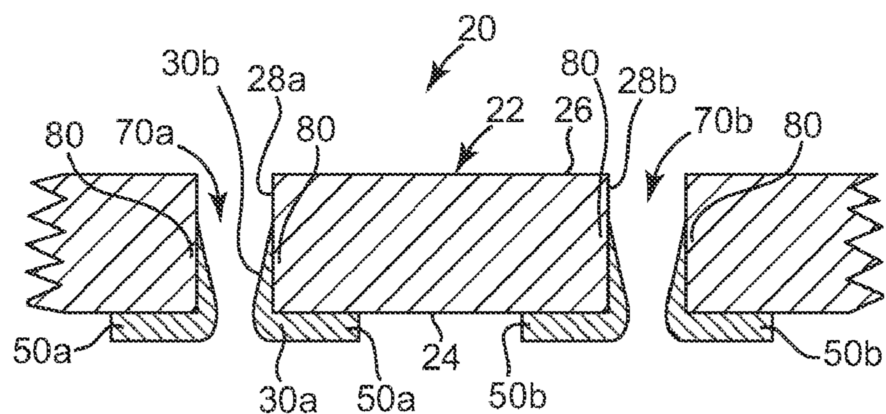
FIG. 5 is a cross-sectional view of a semiconductor package singulated from the wafer shown in FIG. 4 and including sidewall metallization layers according to one embodiment.

FIG. 5 is a cross-sectional view of a central semiconductor package 20 including metallization layer 30*a* extending from contact pad 50*a* onto peripheral side 28*a* of chip 22. FIG. 5 also shows two semiconductor packages adjacent to package 20. In one embodiment, laser singulation of wafer 40 (FIG. 4) displaces a portion of the metal of contact pad 50*a* and the metal flows onto and up peripheral side 28*a* of package 20.

In one embodiment, metallization layer 30 includes first portion 30*a* coincident with contact pad 50*a* and second portion 30*b* adjacent to and in contact with the peripheral side 28*a* of chip 22. In one embodiment, the second portion 30*b* of the metallization layer has a thickness that is less than a thickness of the first portion 30*a* of the metallization layer. In one embodiment, each peripheral side 28 of semiconductor package 20 includes a metallization layer that extends from active surface 24 of chip 22 and onto the peripheral sidewall 28.

While not being bound to this theory, it is believed that the energetic laser singulation of wafer 40 cutting through contact pads 50*a*, 50*b* displaces, vaporizes, melts, flows, or otherwise moves some of the metal in pads 50 such that the metal covers part of active surface 24 and at least a portion of each sidewall 28.

In one embodiment, a side edge 80 of 22 chip that is adjacent to the second portion 30*b* of the metallization layer is oxidized during laser singulation of wafer 40. These oxidized side edges 80 of chip 22 provide additional electrical insulation along the sides of chip 22.

Figure 6:
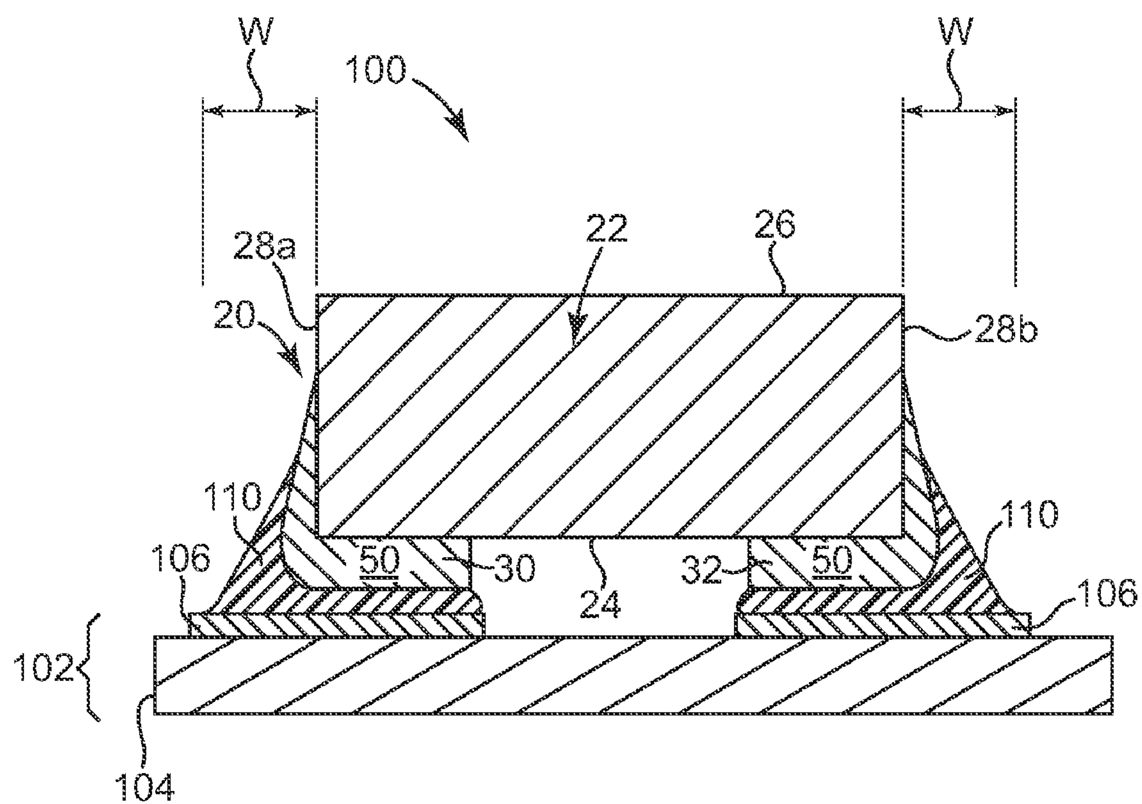
FIG. 6 is a cross-sectional view of an electronic device including a semiconductor package coupled to a board according to one embodiment.

FIG. 6 is a cross-sectional view of an electronic device 100 according to one embodiment. Electronic device 100 includes semiconductor package 20 coupled to a circuit board 102. In one embodiment, circuit board 102 includes a substrate 104 and electrical interfaces 106 coupled to substrate 104. Other suitable configurations for board 102 are also acceptable, including printed circuit boards and motherboards to name just two. Semiconductor package 20 is electrically coupled to electrical interfaces 106, and thus to board 102. It can be desirable for some board users to verify optically that the electrical connections between package 20 and board 102 have been established. Embodiments described below provide a semiconductor package 20 including sidewall metallization that is configured to enable optical verification of the electrical connection between package 20 and board 102.

In one embodiment, semiconductor package 20 is coupled to circuit board 102 by solder 110 that extends between metallization layer 30 and interface 106. In one embodiment, solder 110 is disposed between contact pads 50 and electrical interface 106, and solder 110 is in electrical communication with metallization layer 30 on peripheral sides 28 of chip 22. In one embodiment, solder 110 includes a metal solder such as a tin solder, or an alloy of tin solder. Other forms of solder 110 including conductive pastes and glues are also acceptable.

In one embodiment, solder 110 and metallization layer 30 extend laterally beyond sidewalls 28*a*, 28*b* of semiconductor package 20 by a dimension W on each side, such that the electrical connection between formed between semiconductor package 20 and circuit board 102 by solder 110 is optically visible when electronic device 100 is viewed from the top.

Figure 7:
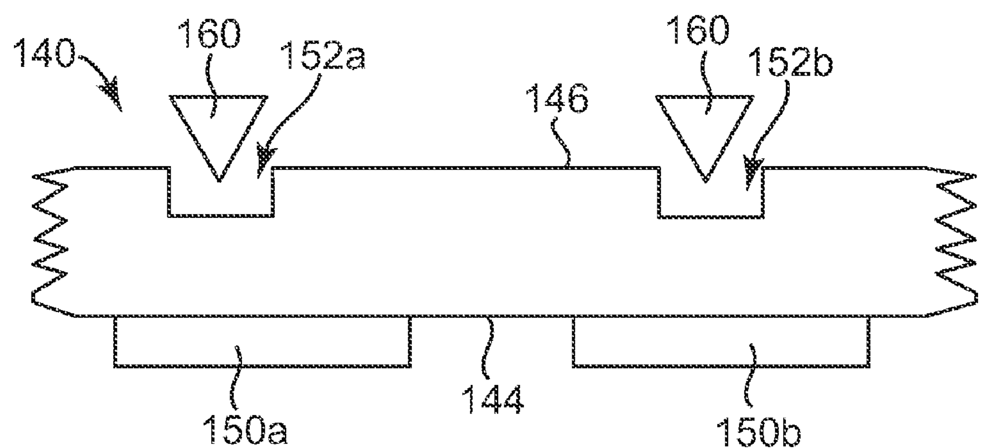
FIG. 7 is a side view of a semiconductor wafer including a back side having streets sawed into a portion of the back side according to one embodiment.

FIG. 7 is a side view of a semiconductor wafer 140 according to another embodiment. Semiconductor wafer 140 includes a silicon wafer defining an active surface 144, a back side 146 opposite active surface 144, and metal pads 150*a*, 150*b* coupled to active surface 144. In one embodiment, wafer 140 is fabricated to include a plurality of semiconductor chips that are exposed on active surface 144 and in contact with pads 150*a*, 150*b*. Pads 150*a*, 150*b* provide electrical communication through wafer 140 and through chips disposed on wafer 140.

In one embodiment, wafer 140 includes trenches 152*a*, 152*b* that are partially sawn, or pre-sawn, into back side 146. In one embodiment, a wafer saw is employed to saw trenches 152*a*, 152*b* into a portion of back side 146 of wafer 140 such that the trenches 152*a*, 152*b* are aligned with pads 150*a*, 150*b*, respectively.

In one embodiment, a source 160 is employed to singulate wafer 140 by energetically cutting into trenches 152*a*, 152*b* and entirely through wafer 140 and pads 150*a*, 150*b*. In one embodiment, source 160 is similar to source 60 described above and includes an Nd:YAG laser or other suitable source. In one embodiment, trenches 152*a*, 152*b* are centered above pads 150*a*, 150*b*. In another embodiment, trenches 152*a*, 152*b* are aligned off-center relative to pads 150*a*, 150*b*.

Figure 8:
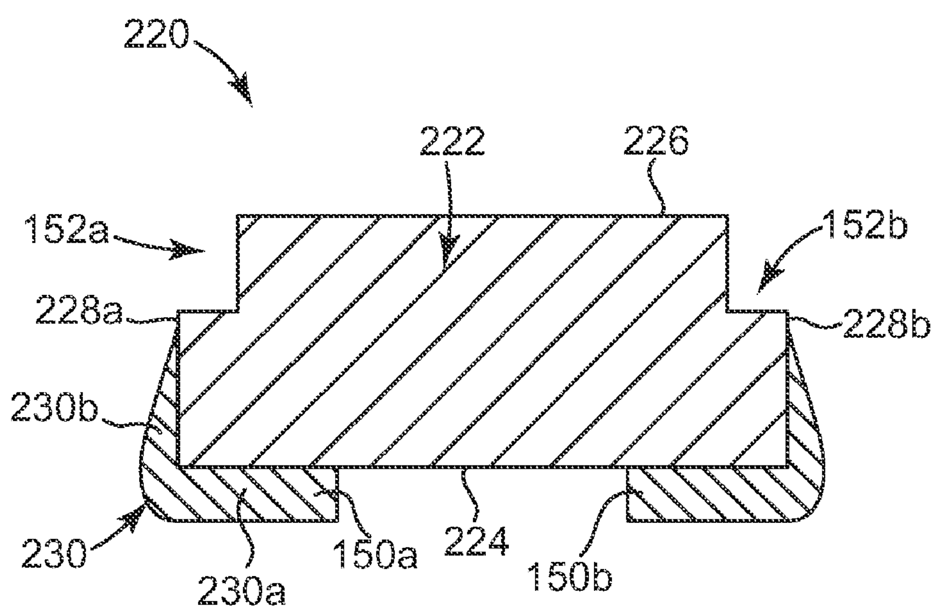
FIG. 8 is a cross-sectional view of a semiconductor package singulated from the wafer shown in FIG. 7 according to one embodiment.

FIG. 8 is a cross-sectional view of a semiconductor package 220 as singulated from wafer 140 (FIG. 7) according to one embodiment. Semiconductor package 220 includes a chip 222 defining an active surface 224, a back side 226 opposite active surface 224, and peripheral sides 228*a*, 228*b* having a sidewall metallization layer 230*b*. In one embodiment, the source 160 (FIG. 7) energetically singulates semiconductor package 220 from wafer 140 such that contact pad 150*a* is displaced to contact both active surface 224 of chip 222 and sidewall 228*a* of chip 222. In one embodiment, energetic singulation of semiconductor package 220 forms a metallization layer 230 from pad 150*a*, for example, that includes a first portion 230*a* in contact with active surface 224 and a second portion 230*b* in contact with sidewall 228*a*.

In one embodiment, the trenches 152*a*, 152*b* that were partially sawn into wafer 140 (FIG. 7) remain to define steps 152*a*, 152*b* in the singulated semiconductor package 220. In one embodiment, steps 152*a*, 152*b* provide a convenient pick-and-place surface that enables easy placement of package 220 onto circuit boards during semiconductor fabrication.

In one embodiment, steps 152*a*, 152*b* of semiconductor package 220 define a boundary for metallization layer 230, where second portion 230*b* of metallization layer extends up peripheral sidewall up to step 152*a*. Thus, in one embodiment steps 152*a*, 152*b* of semiconductor package 220 provide a "stop" that impedes the flow/movement of metallization layer 230 up the side 228 of package 220.

A semiconductor package is provided including a sidewall metallization layer. The sidewall metallization layer enables improved electrical connection between the semiconductor package and boards to which the package is mounted.

An electronic device is provided including a semiconductor package with sidewall metallization that is mounted to a circuit board. Peripheral sides of the semiconductor package include a metallization layer configured for electrical connection to the circuit board. A portion of the metallization layer on the peripheral sides of the chip is visible when viewed from above, thus providing a quick visualization of the presence of electrical connection between the package and the board. Some embodiments provide rapid visual confirmation of high quality electrical connection between semiconductor packages and a circuit board to which the semiconductor packages are coupled.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of semiconductor packages having sidewall metallization layer(s) as discussed herein. Therefore, it is intended that this invention be limited only by the claims and the equivalents thereof.

What is claimed is:

1. A semiconductor package singulated from a wafer and comprising:

a chip defining an active surface, a back side opposite the active surface, and peripheral sides extending between the active surface and the back side;

a contact pad disposed on and directly contacting the active surface; and a metallization layer extending from the contact pad onto a portion of the peripheral sides of the chip, wherein the metallization layer comprises a first portion coincident with the contact pad and a second portion adjacent to and in direct contact with the peripheral sides of the chip, wherein the second portion of the metallization layer has a thickness that is less than a thickness of the first portion of the metallization layer, and wherein the contact pad and the metallization layer comprise the same material.

2. The semiconductor package of claim 1, wherein a side edge of the chip that is adjacent to the second portion of the metallization layer comprises an oxidized electrically insulating side edge of the chip.

3. The semiconductor package of claim 1, wherein the metallization layer extends continuously around the peripheral sides of the chip.

4. The semiconductor package of claim 1, wherein the chip comprises one of a diode, a transistor, and a logic chip.

5. A wafer level semiconductor package comprising:

a chip defining an active surface, a back side opposite the active surface, and peripheral sides extending between the active surface and the back side; and a metallization layer comprising a first portion directly contacting the active surface and a second portion extending from the first portion and directly contacting at least a portion of the peripheral sides of the chip, wherein the second portion of the metallization layer has a thickness that is less than a thickness of the first portion of the metallization layer, and wherein the first portion and the second portion comprise the same material.

6. The wafer level semiconductor package of claim 5, wherein the metallization layer is formed by singulating the chip from a wafer and displacing a portion of a contact pad disposed on the active surface onto the peripheral sides of the chip.

7. The wafer level semiconductor package of claim 5, wherein the metallization layer is formed by energetically displacing metal from a contact pad disposed on the active surface to the peripheral sides of the chip.

8. The wafer level semiconductor package of claim 7, wherein energetically displacing metal from the contact pad to the peripheral sides of the chip comprises cutting through the contact pad with a laser.

9. The wafer level semiconductor package of claim 8, wherein cutting through the contact pad with a laser comprises:

cutting into a trench formed on the back side of the chip with the laser; and cutting through the back side of the chip and through the contact pad with the laser.

10. An electronic device comprising:

a circuit board including an electrical interface; and a semiconductor package coupled to the circuit board, the semiconductor package including a chip defining an active surface and a metallization layer, the metallization layer comprising a first portion directly contacting the active surface and a second portion extending from the first portion and directly contacting at least a portion of peripheral sides of the chip;

wherein the peripheral sides of the chip are in electrical communication with the electrical interface of the circuit board, wherein the second portion of the metallization layer has a thickness that is less than a thickness of the first portion of the metallization layer, and wherein the first portion and the second portion comprise the same material.

11. The electronic device of claim 10, wherein the first portion of the metallization layer is soldered to the electrical interface and the second portion of the metallization layer is in electrical communication with the solder.

12. The electronic device of claim 11, wherein the second portion of the metallization layer extends continuously around the peripheral sides of the chip.

13. The electronic device of claim 11, wherein the chip defines four peripheral sides and the second portion of the metallization layer is in contact with each of the four peripheral sides of the chip.

14. The electronic device of claim 13, wherein the second portion of the metallization layer and the solder extends an optically visible distance away from each of the peripheral sides of the chip.

15. An electronic device comprising:

a circuit board including a top surface having an electrical interface; and at least one semiconductor package coupled to the electrical interface, the at least one semiconductor package including a chip defining an active surface and a metallization layer, the metallization layer comprising a first portion directly contacting the active surface and a second portion extending from the first portion and directly contacting at least a portion of peripheral sides of the chip;

wherein the metallization layer on the peripheral sides of the chip is visible when the top surface of the circuit board is viewed optically, wherein the second portion of the metallization layer has a thickness that is less than a thickness of the first portion of the metallization layer, and wherein the first portion and the second portion comprise the same material.

16. The electronic device of claim 15, wherein the first portion of the metallization layer is soldered to the electrical interface and the second portion of the metallization layer is in electrical communication with the solder.

17. The electronic device of claim 16, wherein the second portion of the metallization layer extends continuously around the peripheral sides of the chip.

18. The electronic device of claim 16, wherein the chip defines four peripheral sides and the second portion of the metallization layer contacts each of the four peripheral sides of the chip.

19. The electronic device of claim 16, wherein the second portion of the metallization layer and the solder extend a distance away from each of the peripheral sides of the chip.

20. A semiconductor package singulated from a wafer and comprising:

a chip defining an active surface, a back side opposite the active surface, and peripheral sides extending between the active surface and the back side and defining a step between the active surface and the back side such that an area of the back side is less than an area of the active surface;

a contact pad disposed on the active surface; and a metallization layer extending from the contact pad onto a portion of the peripheral sides of the chip up to the step.

21. The semiconductor package of claim 20, wherein the contact pad and the metallization layer comprise the same material.

22. The semiconductor package of claim 21, wherein the metallization layer comprises a first portion coincident with the contact pad and a second portion adjacent to and in contact with the peripheral sides of the chip, wherein the second portion of the metallization layer has a thickness that is less than a thickness of the first portion of the metallization layer.

23. The semiconductor package of claim 22, wherein a side edge of the chip that is adjacent to and in contact with the second portion of the metallization layer comprises an oxide.

24. The semiconductor package of claim 20, wherein the chip comprises one of a diode, a transistor, and a logic chip.

* * * * *